(12) United States Patent
Jia et al.

(10) Patent No.: US 12,144,172 B2
(45) Date of Patent: Nov. 12, 2024

(54) METHOD OF FORMING A SEMICONDUCTOR DEVICE WITH MEMORY CELLS, HIGH VOLTAGE DEVICES AND LOGIC DEVICES ON A SUBSTRATE USING A DUMMY AREA

(71) Applicant: Silicon Storage Technology, Inc., San Jose, CA (US)

(72) Inventors: Zhuoqiang Jia, Mountain View, CA (US); Leo Xing, Shanghai (CN); Xian Liu, Sunnyvale, CA (US); Serguei Jourba, Aix en Provence (FR); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 442 days.

(21) Appl. No.: 17/745,639

(22) Filed: May 16, 2022

(65) Prior Publication Data

US 2023/0262975 A1 Aug. 17, 2023

Related U.S. Application Data

(60) Provisional application No. 63/310,020, filed on Feb. 14, 2022.

(51) Int. Cl.
*H10B 41/49* (2023.01)
*H01L 21/28* (2006.01)
(Continued)

(52) U.S. Cl.
CPC ........ *H10B 41/49* (2023.02); *H01L 29/40114* (2019.08); *H01L 29/66825* (2013.01);
(Continued)

(58) Field of Classification Search
CPC ........ H10B 41/49; H10B 41/35; H10B 41/41; H01L 29/66825; H01L 29/42328
See application file for complete search history.

(56) References Cited

U.S. PATENT DOCUMENTS

| 6,747,310 B2 | 6/2004 | Fan et al. |
|---|---|---|
| 7,868,375 B2 | 1/2011 | Liu et al. |

(Continued)

FOREIGN PATENT DOCUMENTS

| WO | 2017 014866 | 1/2017 |
|---|---|---|
| WO | 2021/262235 | 12/2021 |

OTHER PUBLICATIONS

PCT Search Report and Written Opinion dated Oct. 28, 2022 corresponding to the related PCT Patent Application No. US2022/029909.

(Continued)

*Primary Examiner* — Joseph C. Nicely
(74) *Attorney, Agent, or Firm* — DLA Piper LLP (US)

(57) ABSTRACT

A method of forming a device on a semiconductor substrate having first, second, third and dummy areas, includes recessing the substrate upper surface in the first, second and dummy areas, forming a first conductive layer over the substrate, removing the first conductive layer from the third area and a second portion of the dummy area, forming a first insulation layer over the substrate, forming first trenches through the first insulation layer and into the substrate in the third area and the second portion of the dummy area, forming second trenches through the first insulation layer, the first conductive layer and into the substrate in the first and second areas and a first portion of the dummy area, and filling the first and second trenches with insulation material. Then, memory cells are formed in the first area, HV devices in the second area and logic devices in the third area.

10 Claims, 22 Drawing Sheets

(51) Int. Cl.
    *H01L 29/66*     (2006.01)
    *H10B 41/35*     (2023.01)
    *H10B 41/41*     (2023.01)
    *H01L 29/423*     (2006.01)

(52) U.S. Cl.
    CPC ............ *H10B 41/35* (2023.02); *H10B 41/41* (2023.02); *H01L 29/42328* (2013.01)

(56) References Cited

U.S. PATENT DOCUMENTS

| | | |
|---|---|---|
| 7,927,994 B1 | 4/2011 | Liu et al. |
| 9,276,005 B1 | 3/2016 | Zhou et al. |
| 2019/0172942 A1 | 6/2019 | Yang et al. |
| 2021/0013220 A1 | 1/2021 | Lin et al. |
| 2021/0398995 A1 | 12/2021 | Sun et al. |

OTHER PUBLICATIONS

PCT Search Report and Written Opinion dated Nov. 24, 2021 for PCT Patent Application No. US2021/036311.
U.S. Appl. No. 17/339,880, filed Jun. 4, 2021, Song et al.

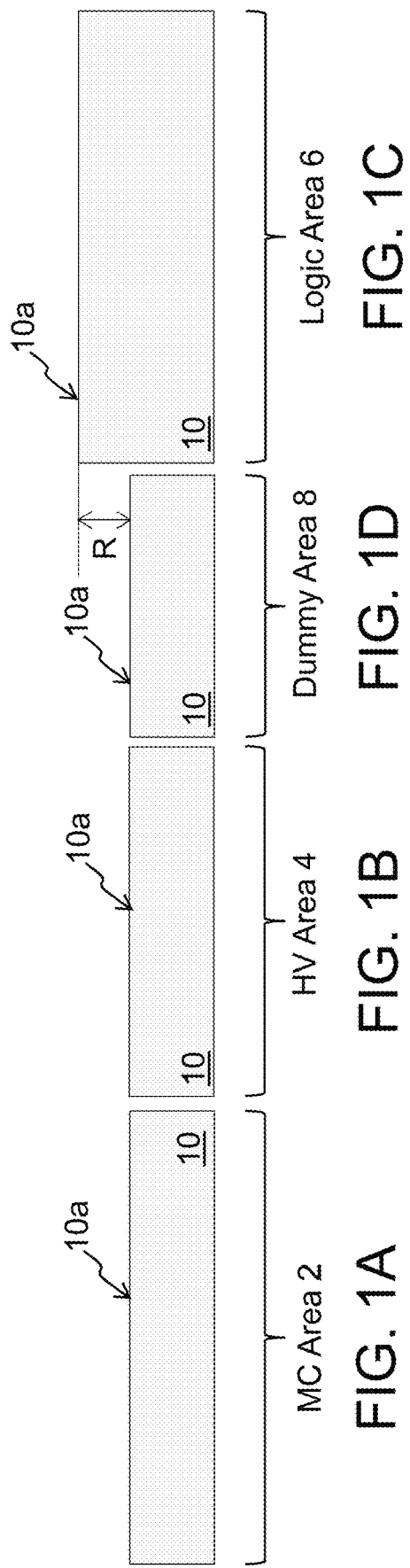

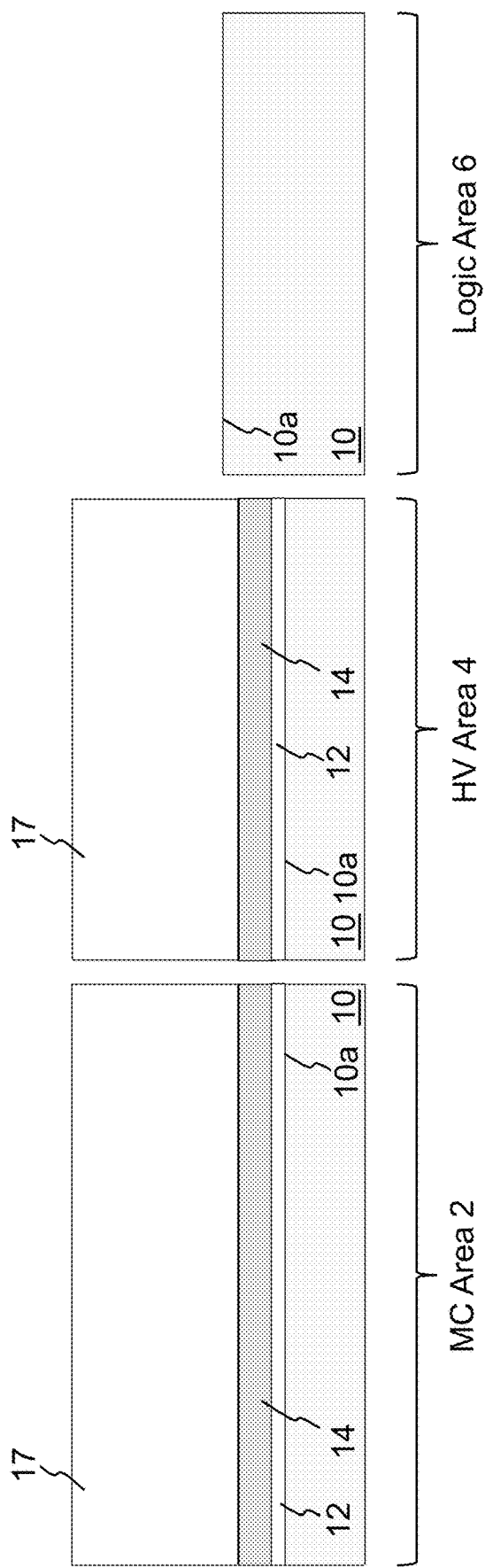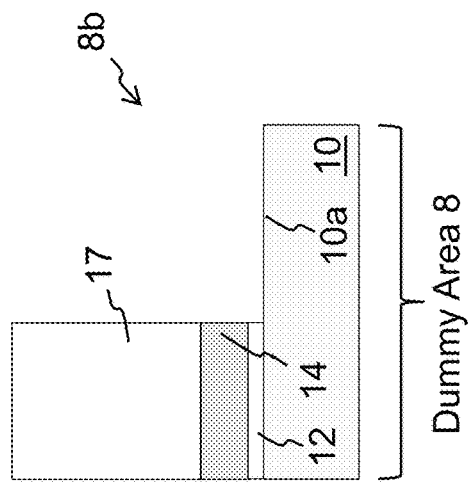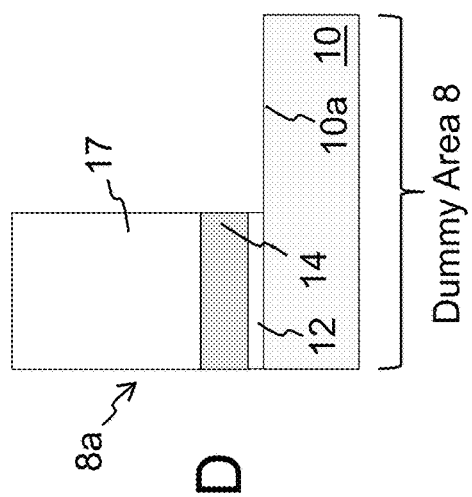

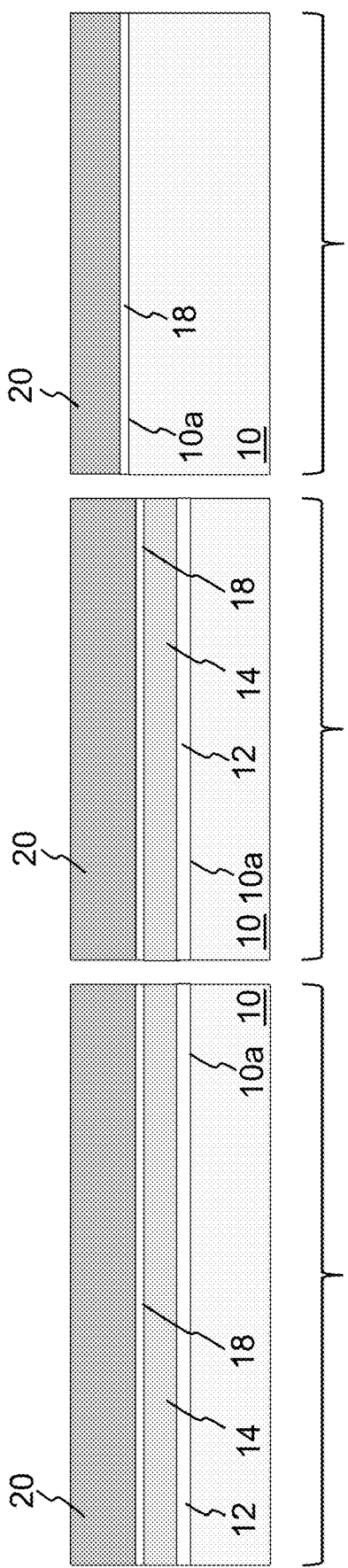
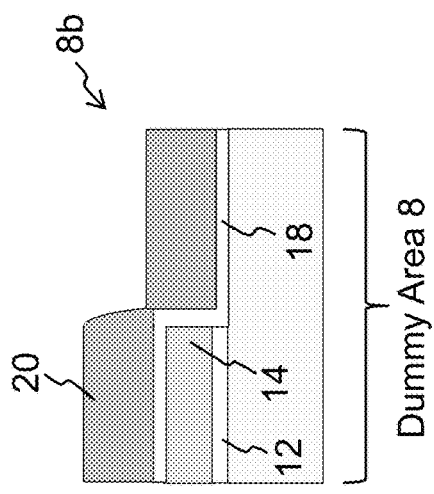
FIG. 3A  FIG. 3B  FIG. 3C  FIG. 3D

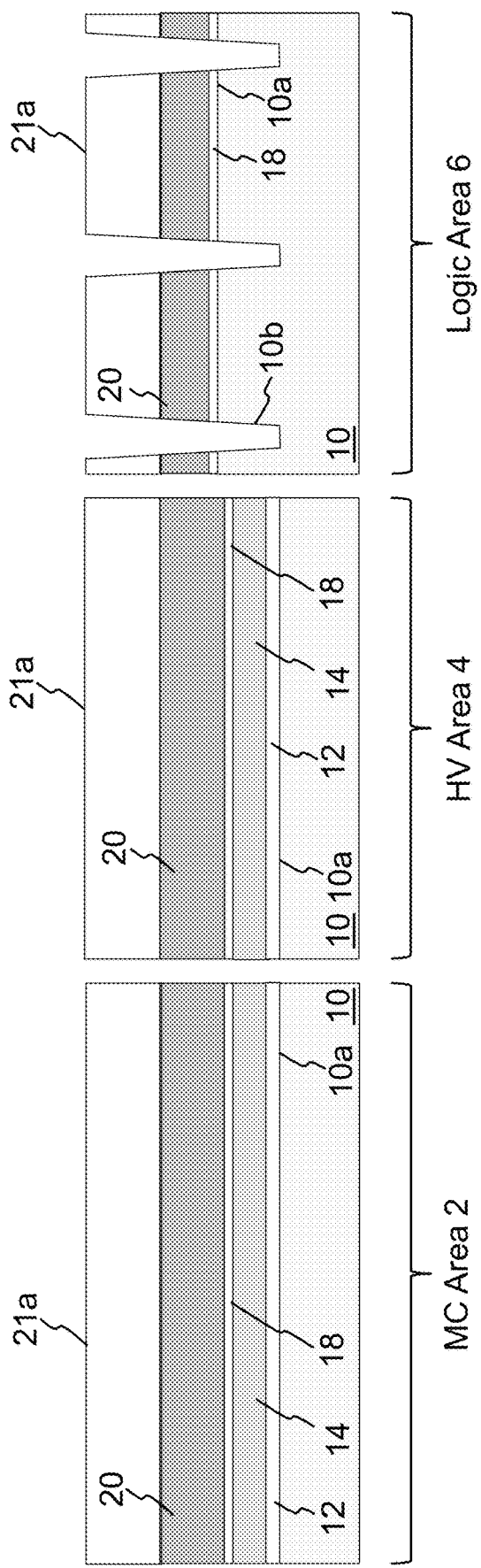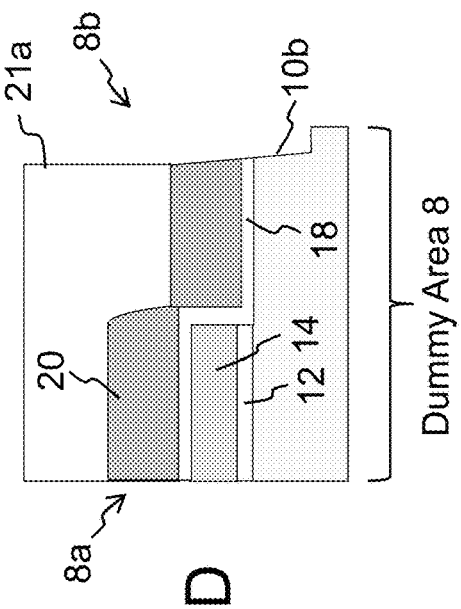

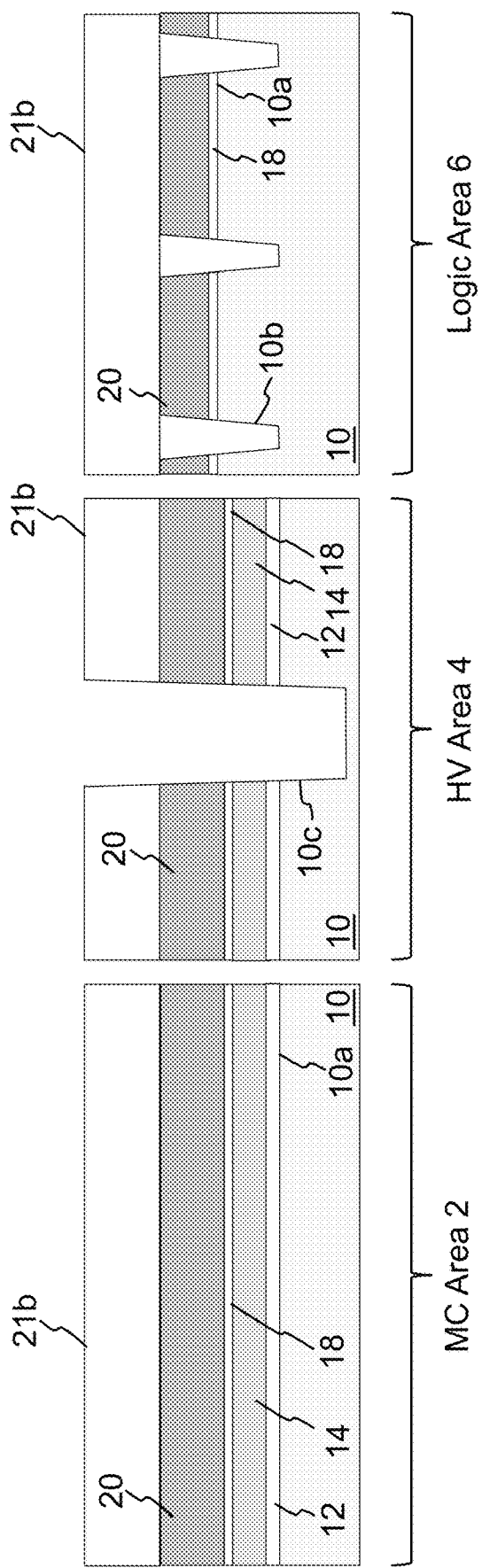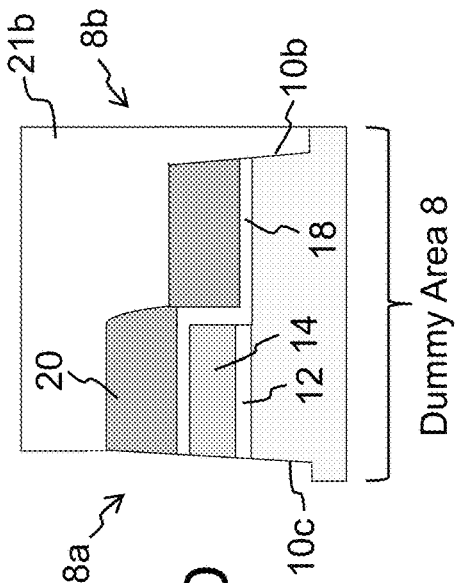

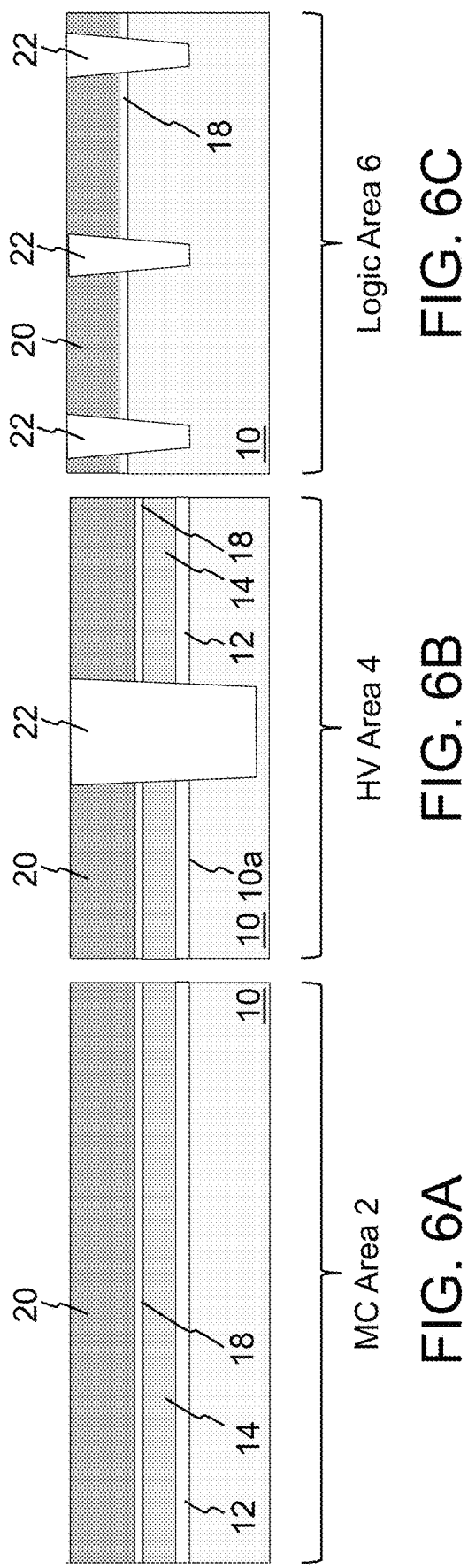

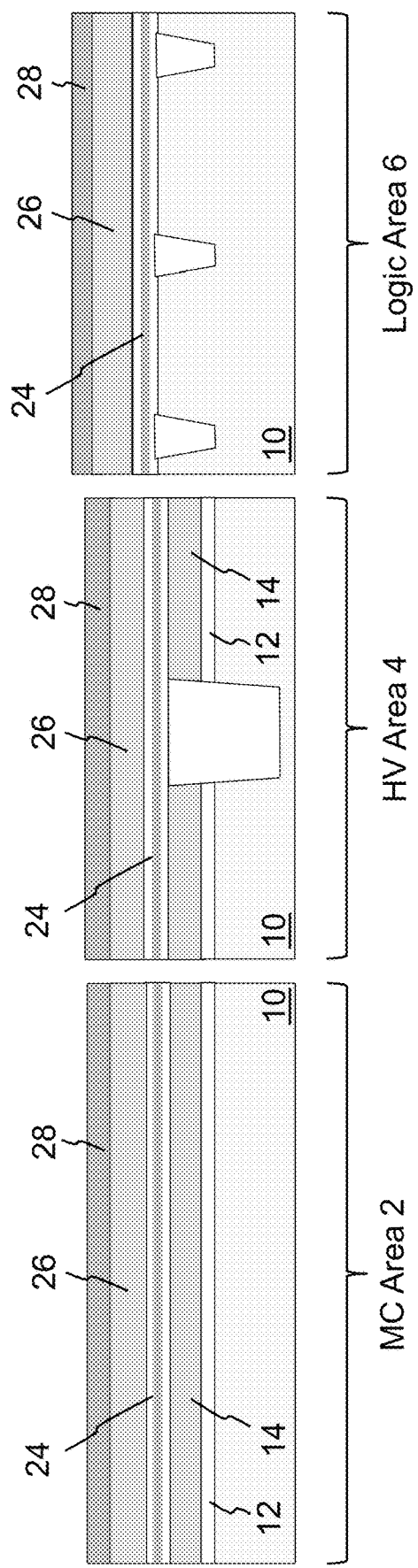

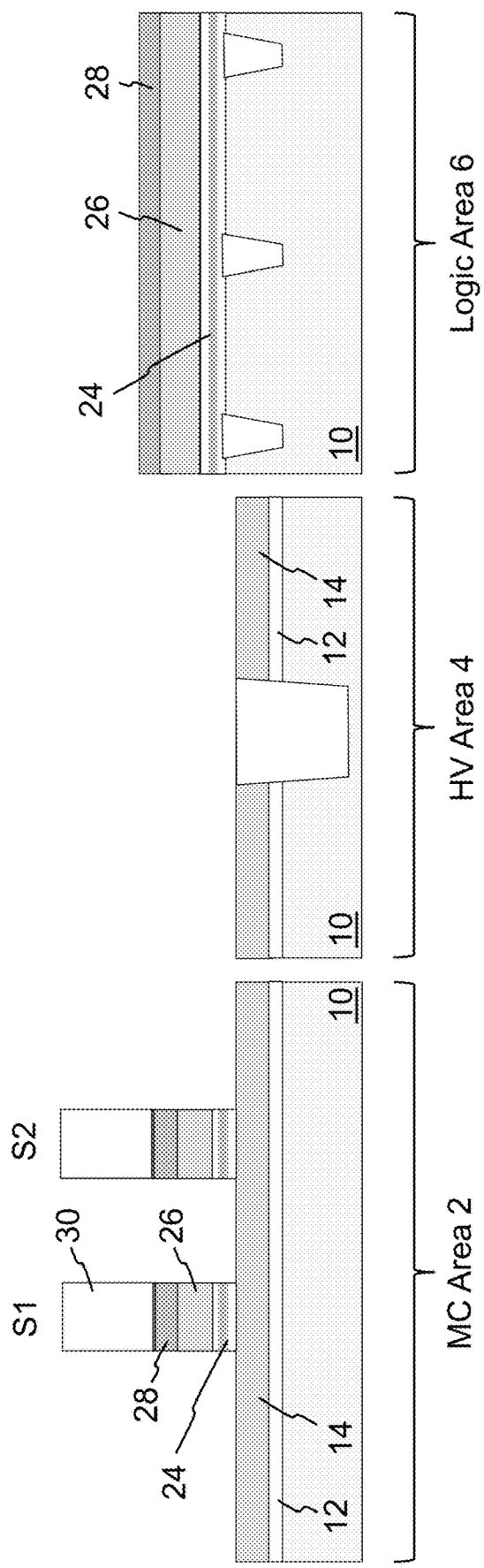

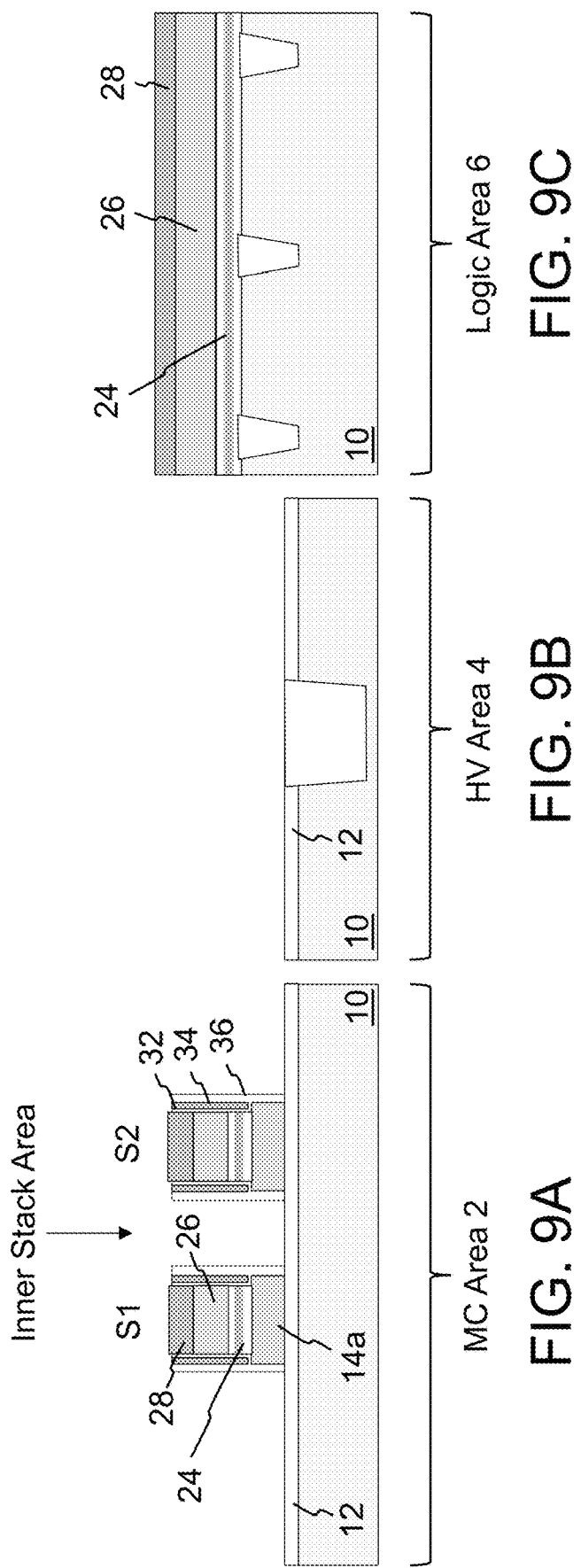

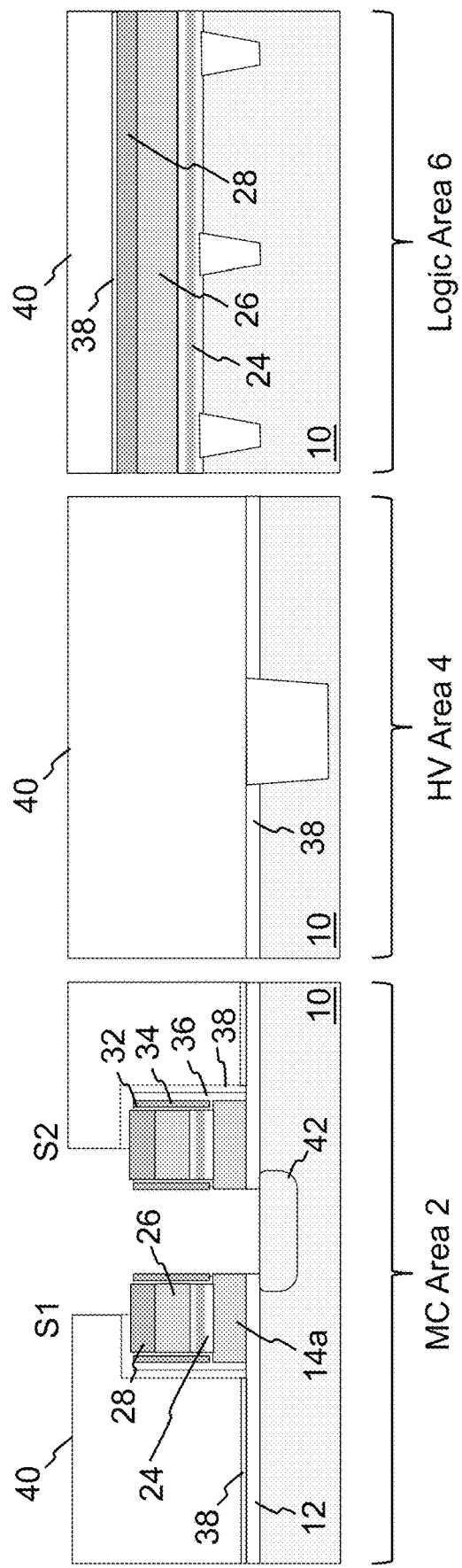
FIG. 10A  MC Area 2
FIG. 10B  HV Area 4
FIG. 10C  Logic Area 6

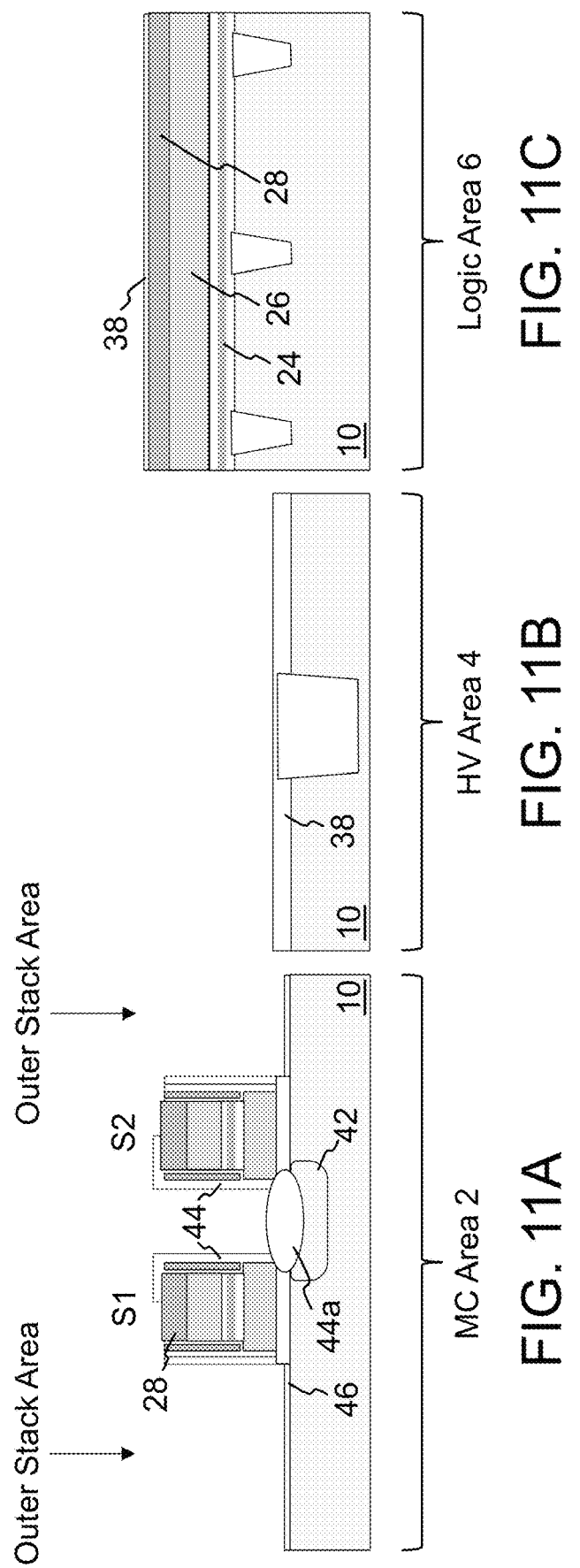

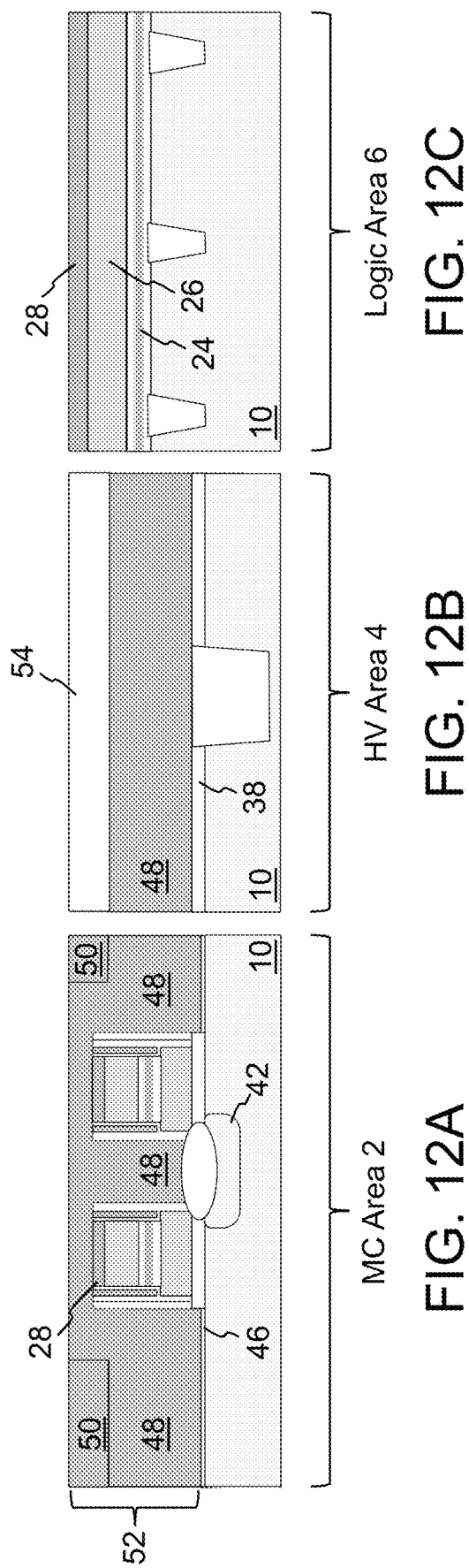

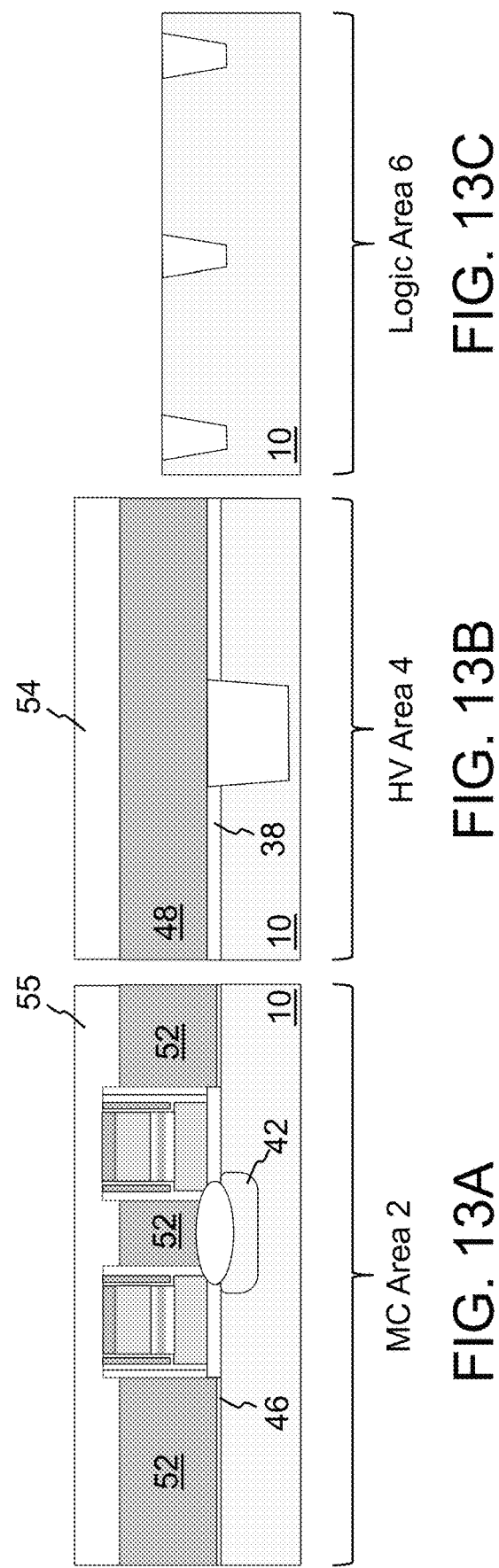

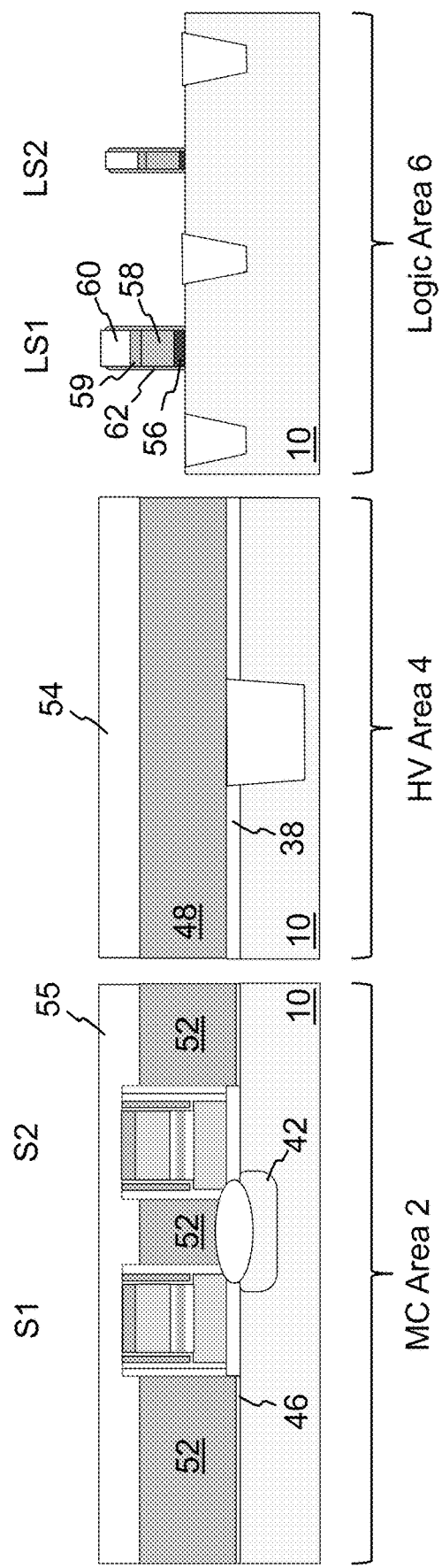

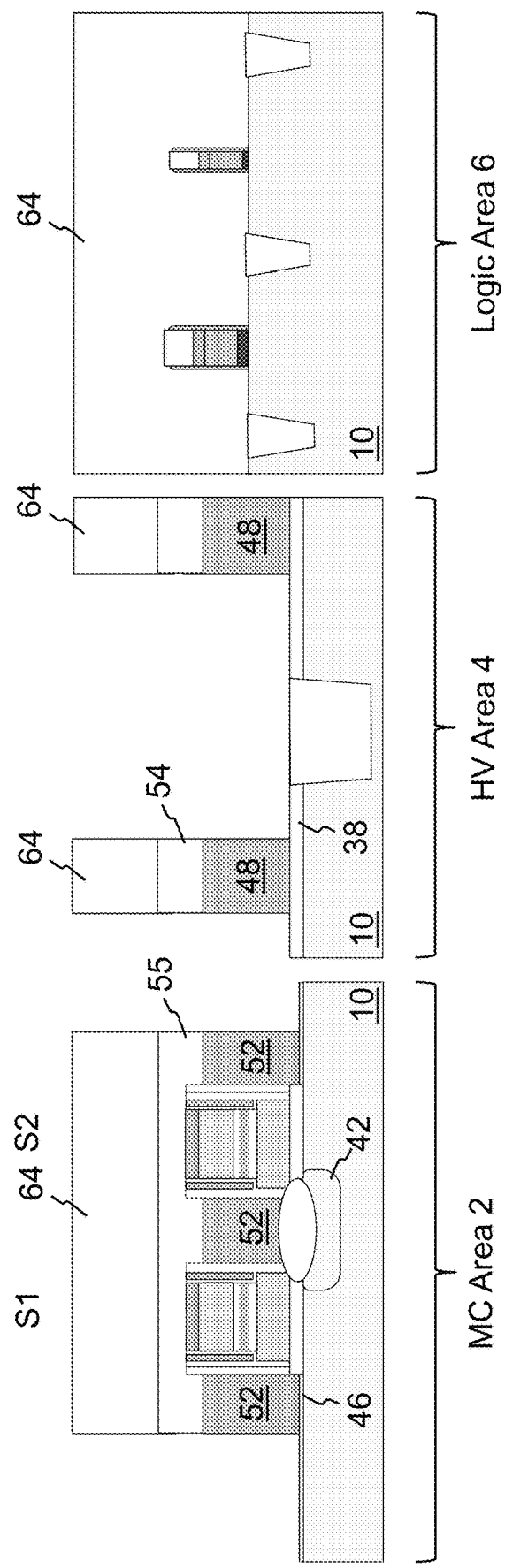

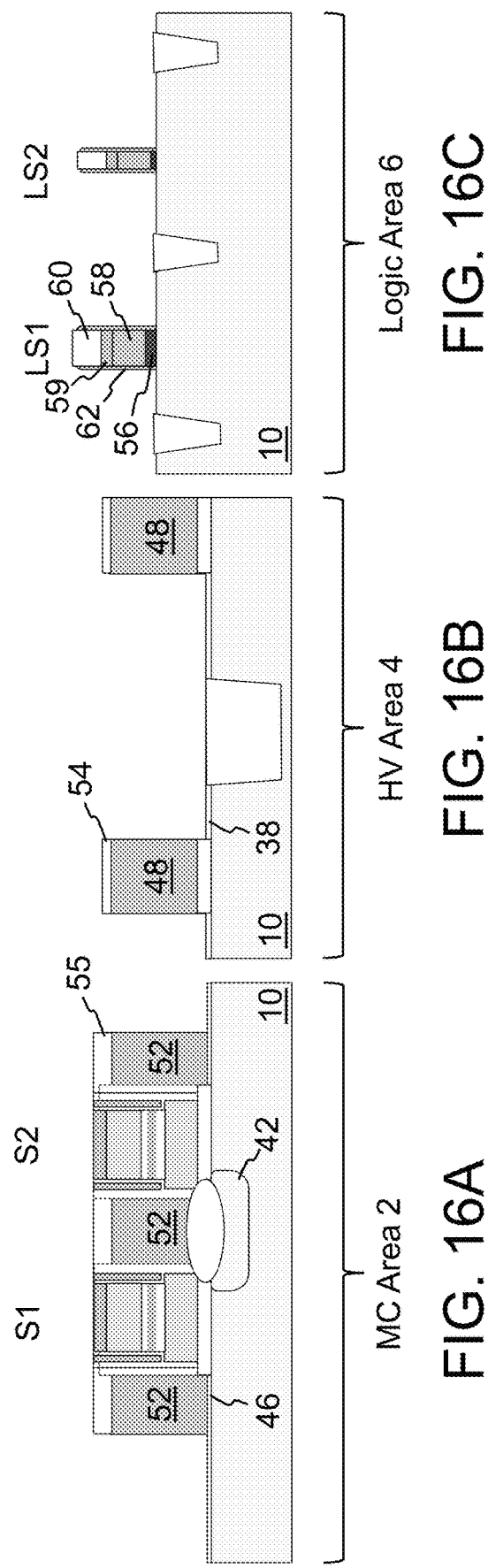

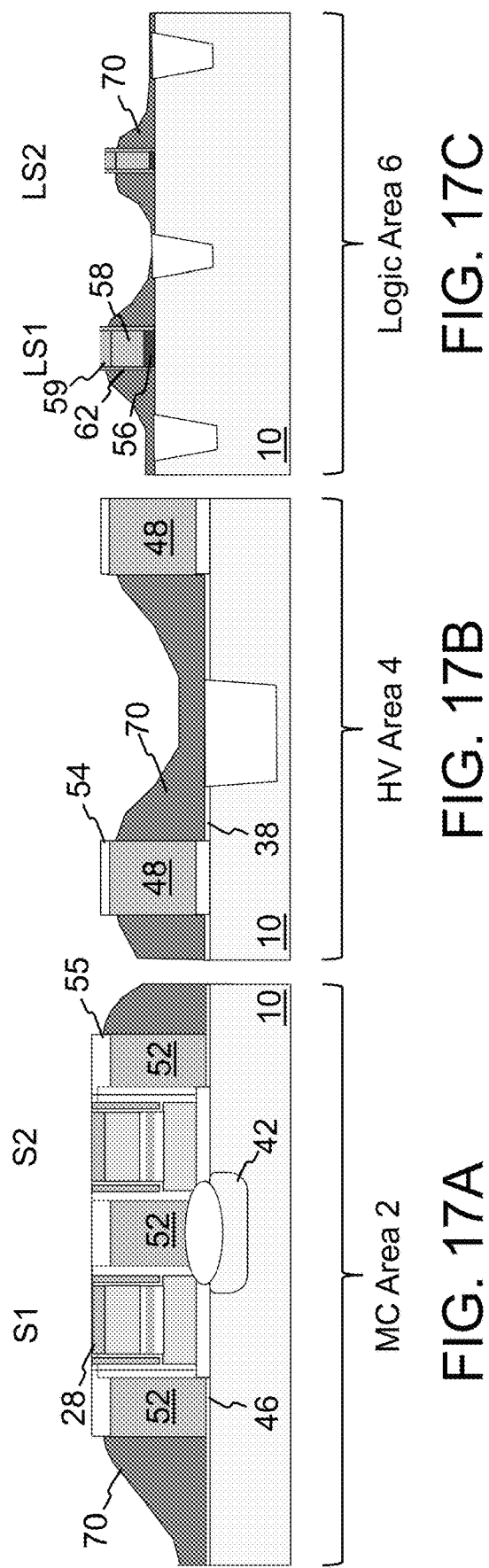

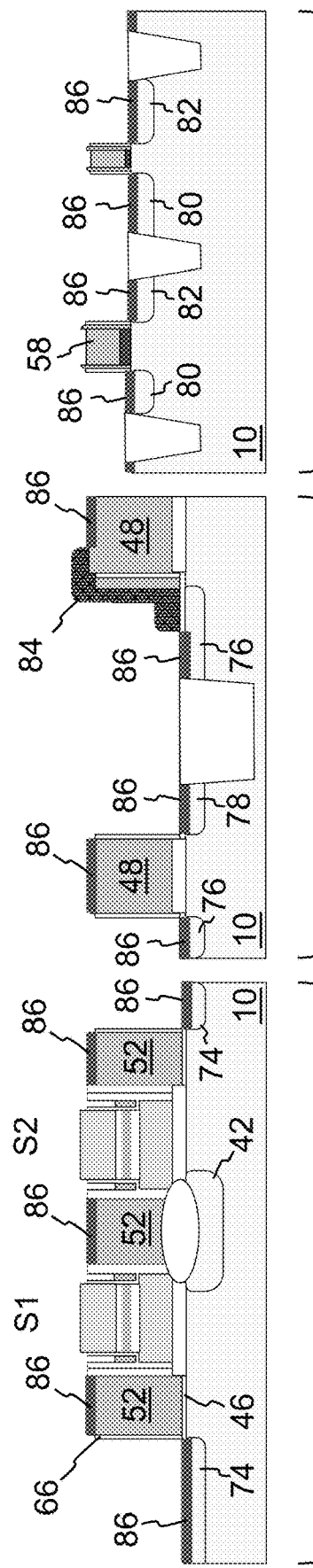

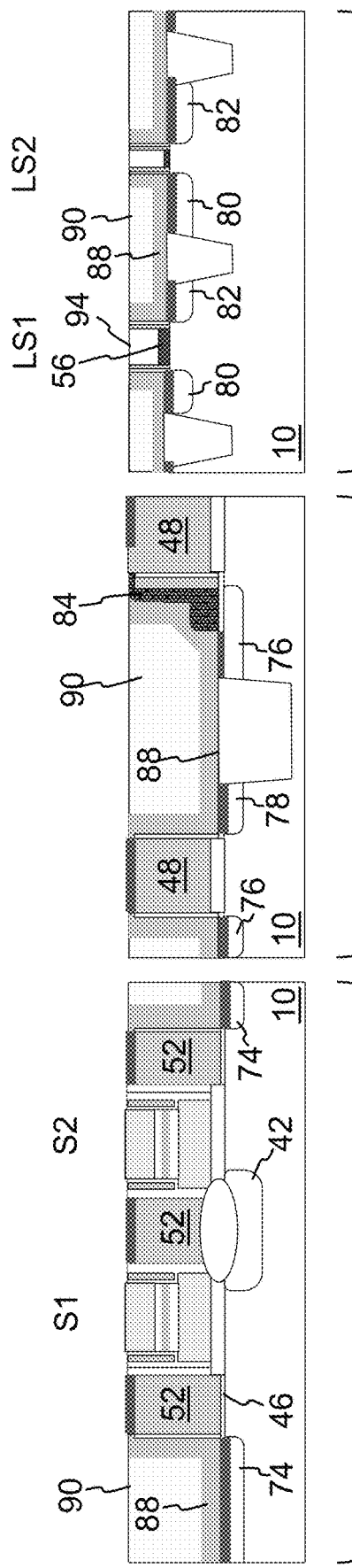

METHOD OF FORMING A SEMICONDUCTOR DEVICE WITH MEMORY CELLS, HIGH VOLTAGE DEVICES AND LOGIC DEVICES ON A SUBSTRATE USING A DUMMY AREA

RELATED APPLICATIONS

This application claims the benefit of U.S. Provisional Application No. 63/310,020, filed Feb. 14, 2022, and which is incorporated herein by reference.

FIELD OF THE INVENTION

The present invention relates to semiconductor devices with embedded non-volatile memory cells.

BACKGROUND OF THE INVENTION

Non-volatile memory semiconductor devices formed on silicon semiconductor substrates are well known. For example, U.S. Pat. Nos. 6,747,310, 7,868,375 and 7,927,994 disclose memory cells with four gates (floating gate, control gate, select gate and erase gate) formed on a semiconductor substrate, which are incorporated herein by reference for all purposes. Source and drain regions are formed as diffusion implant regions into the substrate, defining a channel region therebetween in the substrate. The floating gate is disposed over and controls the conductivity of a first portion of the channel region, the select gate is disposed over and controls the conductivity of a second portion of the channel region, the control gate is disposed over the floating gate, and the erase gate is disposed over the source region and laterally adjacent to the floating gate.

It is also known to form low and high voltage logic devices on the same substrate as the non-volatile memory cells. See for example U.S. Pat. No. 9,276,005, which is incorporated herein by reference for all purposes. New gate materials such as high K insulation and metal gates are also used to increase performance. However, processing steps in forming the memory cells can adversely affect the concurrently fabricated logic devices, and vice versa.

There is a need for an improved method of making a device that includes memory cells, low voltage logic devices and high voltage devices on the same substrate.

BRIEF SUMMARY OF THE INVENTION

The aforementioned problems and needs are addressed by a method of forming a semiconductor device that includes:
providing a substrate of semiconductor material that includes a first area, a second area, a third area and a dummy area, wherein the dummy area has first and second portions;
recessing an upper surface of the substrate in the first area, an upper surface of the substrate in the second area, and an upper surface of the substrate in the dummy area, the recessing relative to an upper surface of the substrate in the third area;
forming a first conductive layer disposed over and insulated from the upper surfaces in the first area, the second area, the third area and the dummy area;
removing the first conductive layer from the third area and from the second portion of the dummy area;
forming a first insulation layer in the first area, the second area, the third area and the dummy area;
forming first trenches through the first insulation layer and into the substrate in the third area and the second portion of the dummy area;
after the forming the first trenches, forming second trenches through the first insulation layer and the first conductive layer and into the substrate in the first area, the second area and the first portion of the dummy area;
filling the first and second trenches with insulation material;
after the filling of the first and second trenches, removing the first insulation layer from the first area, the second area, the third area and the dummy area;
forming a second insulation layer in the first area, the second area and the third area;
forming a second conductive layer on the second insulation layer in the first area, the second area and the third area;
performing one or more etches to selectively remove portions of the first and second conductive layers in the first area, to entirely remove the first and second conductive layers from the second area, and to entirely remove the second conductive layer from the third area, wherein the one or more etches result in pairs of stack structures in the first area with each of the stack structures including a control gate of the second conductive layer disposed over and insulated from a floating gate of the first conductive layer;
forming first source regions in the substrate of the first area each disposed between one of the pairs of stack structures;
forming a third conductive layer disposed over and insulated from the upper surfaces of the substrate in the first area, the second area and the third area;
forming a first protective insulation layer over the third conductive layer in the second area;
after the forming of the first protective insulation layer, forming a fourth conductive layer disposed over the first protective insulation layer in the second area, and over the third conductive layer in the first and third areas, wherein the third and fourth conductive layers form a composite conductive layer in the first area;
performing a chemical mechanical polish or etch-back to remove the third and fourth conductive layers from the third area, and to remove the fourth conductive layer from the second area;
performing an etch to recess an upper surface of the composite conductive layer below tops of the stack structures in the first area, leaving a plurality of erase gates of the composite conductive layer each respectively disposed over and insulated from one of the first source regions in the first area;
forming a second protective insulation layer over the composite conductive layer in the first area;
removing the second conductive layer and the second insulation layer from the third area;
after the removing of the second conductive layer and the second insulation layer from the third area, forming blocks of dummy conductive material disposed over and insulated from the upper surface of the substrate in the third area;
after the forming of the blocks of dummy conductive material in the third area, etching portions of the first and second protective insulation layers, portions of the composite conductive layer in the first area and portions of the third conductive layer in the second area to form a plurality of select gates of the composite conductive layer in the first area each disposed adjacent to one of the stack structures, and to form a plurality of HV gates of the third conductive layer in the second area each disposed over and insulated from the upper surface of the substrate;

forming first drain regions in the substrate of the first area each adjacent to one of the select gates;

forming second source regions in the substrate of the second area each adjacent one of the HV gates;

forming second drain regions in the substrate of the second area each adjacent one of the HV gates;

forming third source regions in the substrate of the third area each adjacent one of the blocks of dummy conductive material;

forming third drain regions in the substrate of the third area each adjacent one of the blocks of dummy conductive material; and replacing each of the blocks of dummy conductive material of the third area with a block of metal material.

Other objects and features of the present disclosure will become apparent by a review of the specification, claims and appended figures.

BRIEF DESCRIPTION OF THE DRAWINGS

FIGS. 1A-19A are cross sectional views of a memory cell area showing steps in forming the memory cells.

FIGS. 1B-19B are cross sectional views of an HV area showing steps in forming the HV devices.

FIGS. 1C-19C are cross sectional views of a logic area showing steps in forming the logic devices.

FIGS. 1D-5D are cross sectional views of a dummy area showing steps in forming the logic devices.

DETAILED DESCRIPTION OF THE INVENTION

Figure 20:
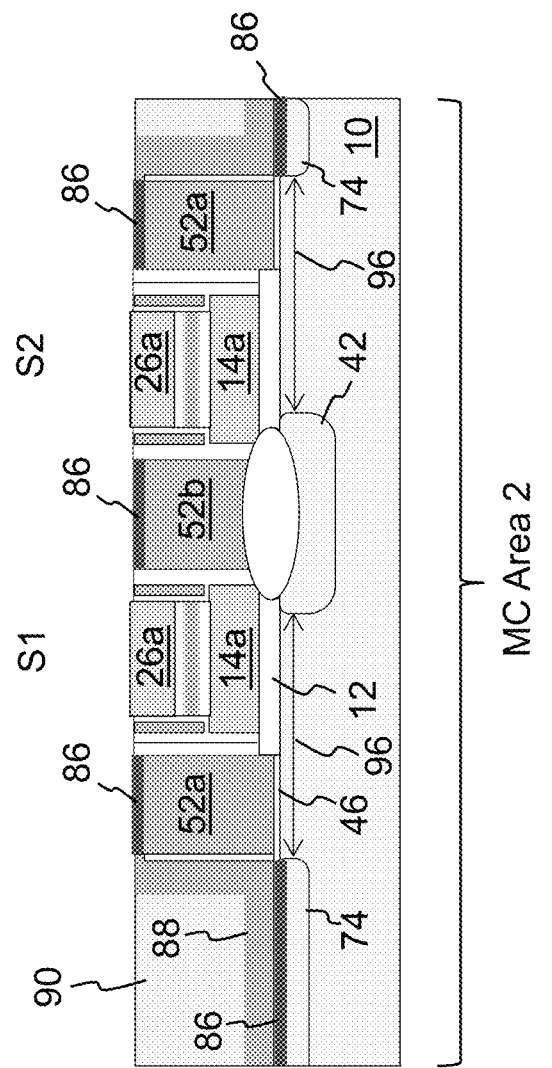
FIG. 20 is a cross sectional view of the memory cell area showing the finished memory cells.

The present disclosure is directed to a process of forming a semiconductor device by simultaneously forming memory cells, low voltage logic devices and high voltage logic devices on the same semiconductor substrate. For the purposes of this disclosure, a low voltage logic device is one that has an operational voltage that is lower than that of a high voltage logic device. The process described below involves forming memory cells in one or more memory cell areas 2 (also referred to as first or MC areas 2) of the substrate 10, high voltage logic devices in one or more high voltage logic device areas 4 (also referred to as second or HV areas 4) of the substrate 10, and low voltage logic devices in one or more low voltage logic device areas 6 (also referred to a third or logic areas 6) of the substrate 10. The process also involves forming a dummy structure in one or more dummy area 8 (also referred to as fourth or dummy areas 8) of the substrate 10. The process is described with respect to forming a pair of memory cells in a MC area 2, a high voltage logic device in an HV area 4, and a low voltage logic device in a logic area 6, simultaneously. However, multiple such devices in each area may be simultaneously formed. Substrate 10 is a substrate of semiconductor material (e.g., silicon).

Referring to FIGS. 1A-19A for the MC area 2, FIGS. 1B-19B for the HV area 4, FIGS. 1C-19C for the logic area 6, and FIGS. 1D-5D for the dummy area 8, there are shown cross-sectional views of the steps in the process to make a semiconductor device. The process begins by recessing the upper surface 10a of the silicon substrate 10 in the MC area 2, HV area 4 and dummy area 8 by a recess amount R relative to the logic area 6. Recessing the substrate upper surface 10a may be performed by forming a silicon dioxide (also referred to herein as "oxide") layer on the substrate upper surface 10a and a silicon nitride (also referred to herein as "nitride") layer on the oxide layer. A photolithography masking operation is performed to cover the logic area 6 but not the MC, HV and dummy areas 2/4/8 with photoresist (i.e., form photoresist over all four areas, selectively expose portion(s) of the photoresist, and selectively remove portion(s) of the photoresist, leaving exposed portion(s) of the underlying structure (in this case the nitride layer in the MC, HV and dummy areas 2/4/8), while leaving other portion(s) of the underlying structure covered by the photoresist (in this case the nitride layer in the logic area 6). Nitride and oxide etches are performed to remove these layers from the MC, HV and dummy areas 2/4/8, leaving the upper surface 10a in these areas exposed. After photoresist removal, a thermal oxidation is then performed to form an oxide layer on the exposed portions of the upper surface 10a in the MC, HV and dummy areas 2/4/8, while not affecting the upper surface 10a in the logic area 6 (protected by the nitride and oxide layers). This thermal oxidation process consumes some of the silicon of the substrate 10 in MC, HV and dummy areas 2/4/8, effectively lowering (recessing) the upper surface 10a in these three areas by recess amount R. Nitride and oxide etches are then used to remove all the oxide and nitride layers, resulting in the structure shown in FIGS. 1A, 1B, 1C and 1D. The upper surface 10a in the MC, HV and dummy areas 2/4/8 is recessed by recess amount R (e.g., ~300 A) relative to the upper surface 10a in the logic area 6. Dummy area 8 is disposed between the logic area 6 on the one hand, and the MC and HV areas 2/4 on the other hand Dummy area 8 can be any appropriate shape, including but not limited to the shape of a ring that partially or fully encircles logic area 6.

Next, an oxide layer 12 is formed on the upper surface 10a (e.g., by deposition or by thermal growth). Thereafter, a conductive layer 14 (i.e., a first conductive layer), such as a polysilicon layer, is formed on oxide layer 12. Conductive layer 14 could instead be amorphous silicon, either in-situ doped or undoped. An implantation and anneal is performed if polysilicon or amorphous silicon is used for conductive layer 14. A photolithography masking operation is then performed to cover the MC and HV areas 2/4, and a first portion 8a of the dummy area 8, with photoresist 17, but leaving the logic area 6 and a second portion 8b of the dummy area 8 exposed (i.e., the photoresist 17 is removed from the logic area 6 and the second portion 8b of the dummy area 8 as part of the masking operation). One or more etches are used to remove the exposed portions of conductive layer 14 and oxide layer 12 in the logic area 6 and the second portion 8b of the dummy area 8. The resulting structure is shown in FIGS. 2A, 2B, 2C and 2D.

After photoresist 17 is removed, an oxide layer 18 is formed on conductive layer 14 in the MC, HV areas 2/4 and the first portion 8a of dummy area 8, and on the upper surface 10a of substrate 10 in logic areas 6 and the second portion 8b of dummy area 8. A nitride layer 20 (also referred to herein as the first insulation layer) is formed on oxide layer 18. The resulting structure is shown in FIGS. 3A, 3B, 3C and 3D. A photolithography masking operation is then performed to completely cover nitride layer 20 with photoresist 21a in the MC area 2, HV area 4 and the first portion 8a of dummy area 8, and selectively cover nitride layer 20 with photoresist 21a in the logic area 6 and the second portion 8b of dummy area 8 (i.e., leave selective portions of nitride layer 20 exposed in logic area 6 and second portion 8b of dummy area 8). One or more etches are performed to form trenches through exposed portions of nitride layer 20, oxide layer 18, and into silicon substrate 10, leaving trenches 10b (also referred to herein as first trenches) formed in substrate 10 in the logic area 6 and in the second portion 8b of dummy area 8 lacking the first conductive layer 14, but with no such trenches formed in the MC and HV areas 2/4, as shown in FIGS. 4A, 4B, 4C and 4D. After photoresist 21a is removed, a photolithography masking operation is then performed to completely cover nitride layer 20 with photoresist 21b in the logic area 6 and the second portion 8b of dummy area 8, and selectively cover nitride layer 20 with photoresist 21b in the MC area 2, the HV area 4 and the first portion 8a of dummy area (i.e., leave selective portions of nitride layer 20 exposed in the MC area 2, the HV area 4 and the first portion 8a of dummy area 8). One or more etches are performed to form trenches through exposed portions of nitride layer 20, oxide layer 18, polysilicon layer 14, oxide layer 12 and into silicon substrate 10, leaving trenches 10c (also referred to herein as second trenches) formed in substrate 10 in the MC and HV areas 2/4, and the first portion 8a of dummy area 8, but without forming trenches 10c in logic area 6, as shown in FIGS. 5A, 5B, 5C and 5D (trenches 10c in the MC area 2 are parallel to the view of FIG. 5A and thus are not shown in FIG. 5A).

After photoresist 21b is removed, the first and second trenches 10b and 10c are then filled with oxide 22 by oxide deposition and chemical mechanical polish (CMP) stopping on nitride layer 20, as shown in FIGS. 6A, 6B, and 6C. The second trenches 10c filled with oxide 22 extend parallel to the active regions in the MC area 2, and because FIG. 6A is a cross sectional view of one of the active regions, the second trenches 10c filled with oxide 22 in the MC area 2 are not shown in FIG. 6A. Oxide 22 is an insulation material that can also be referred to as STI (shallow trench isolation) oxide 22. STI oxide 22 can include a liner oxide formed by thermal oxidation before the oxide deposition.

A nitride etch is then used to remove nitride layer 20 from MC/HV/logic/dummy areas 2/4/6/8. A series of implants can be performed to create the desired wells in the substrate 10 in each of the MC/HV/logic areas 2/4/6 (with photoresist protecting one or more of the other areas during each implantation), followed by an oxide etch back to recess the STI oxide 22 below the top of nitride layer 20. An insulation layer 24 (also referred to herein as the second insulation layer) is then formed over the structure. The insulation layer 24 can be an ONO insulation layer which is a composite layer with oxide/nitride/oxide sublayers (formed by oxide, nitride, oxide depositions and anneal). However, insulation layer 24 could instead be formed of a composite of other dielectric layers, or a single dielectric material with no sublayers. A conductive layer 26 (i.e., a second conductive layer), such as a polysilicon layer, is then formed on the structure, in one example by deposition. Conductive layer 26 could instead be amorphous silicon, either in-situ doped or undoped. An implantation and anneal is performed if polysilicon or undoped amorphous silicon is used for conductive layer 26. A hard mask layer 28 is then formed on conductive layer 26. Hard mask layer 28 can be nitride, SiCN, or a composite of that can include oxide, nitride or SiCN layers. The resulting structure is shown in FIGS. 7A, 7B and 7C.

A photolithography masking operation is used to form photoresist 30 on the structure, where photoresist 30 is removed from the HV area 4 and selectively removed from the MC area 2, to expose hard mask layer 28 in the HV area 4 and exposed portions of hard mask layer 28 in the MC area 2. A series of etches are used to remove exposed portions of hard mask layer 28, conductive layer 26 and insulation layer 24, leaving pairs of spaced apart stack structures S1 and S2 of hard mask layer 28, conductive layer 26 and insulation layer 24 in the MC area 2, and entirely removing these layers from the HV area 4. The resulting structure is shown in FIGS. 8A, 8B and 8C.

After photoresist 30 is removed, an oxide deposition or thermal oxidation, followed by oxide etch, are used to form oxide spacers 32 along the sides of stack structures S1 and S2 in the MC area 2. A nitride deposition and etch are used to form nitride spacers 34 along the sides of oxide spacers 32. The oxide and nitride etches may be combined. An etch, such as a polysilicon or silicon etch, depending on the material of conductive layer 14, is performed to remove the exposed portions of conductive layer 14, with the result that each spaced apart stack structure S1/S2 includes a block of conductive material 14a remaining from conductive layer 14 in the MC area 2, and conductive layer 14 is entirely removed from the HV area 4. Oxide spacers 36 are formed on the sides of the stack structures S1/S2 including along the exposed ends of the blocks of conductive material 14a by oxide deposition and oxide anisotropic etch, as shown in FIGS. 9A, 9B and 9C.

A photolithographic masking operation is used to cover MC and logic areas 2/6 with photoresist, but leave exposed HV area 4. An oxide etch is used to remove oxide layer 12 from the HV area 4. After photoresist removal, insulation layer 38 is then formed on the substrate upper surface 10a in the HV area 4 by thermal growth, deposition, or both, as well as on the structures in the MC area 2 and in logic area 6. Insulation layer 38 can be oxide, oxynitride, or both, and will serve as the gate oxide for the HV devices. However, it should be noted that the removal and replacement of oxide layer 12 with insulation layer 38 is optional, and oxide layer 12 could instead be used as part of, or the entirety of, the gate oxide for the HV devices in the HV area 4. After photoresist removal, photoresist 40 is formed on the structure and removed from the area between the pair of stack structures S1 and S2 (referred to herein as the inner stack area) in the MC area 2. An implantation process is performed to form source region 42 (referred to herein as the first source region) in the substrate between the pair of stack structures S1 and S2, i.e., in the inner stack area. An oxide etch is then used to remove insulation layer 38, oxide spacers 36 and the oxide layer 12 in the inner stack area. The resulting structure is shown in FIGS. 10A, 10B and 10C.

After photoresist 40 is removed, a tunnel oxide 44 is formed on the structure. The tunnel oxide 44 could be oxide, oxynitride, or both, formed by deposition, thermal growth, or both. Because of catalytic effects of the higher dopant levels in the source region 42, tunnel oxide 44 can have a thicker portion 44a on the source region 42. A photolithographic masking operation is used to cover the HV and logic areas 4/6, and the inner stack area in the MC area 2, with photoresist. The areas on the other sides of the pair of stack structures S1 and S2 from the inner stack area (referred to herein as the outer stack areas) are left exposed. An implant can be performed at this time for the portions of substrate 10 in the outer stack areas (i.e., those substrate portions that will be under the select gates that are formed later). An oxide etch is used to remove exposed portions of oxide layer 12 in the outer stack areas. After photoresist removal, insulation layer 46 is then formed on the structure. Insulation layer 46 can be oxide, oxynitride, or both, or any other appropriate dielectric material, formed by deposition, thermal growth, or both. The formation of insulation layer 46 thickens or becomes part of tunnel oxide 44 and insulation layer 38. The resulting structure is shown in FIGS. 11A, 11B and 11C.

A conductive layer 48 (referred to herein as third conductive layer), such as a polysilicon layer, is formed on the structure in the MC, HV and logic areas 2/4/6. Conductive layer 48 can be in-situ doped or undoped, and could instead be amorphous silicon. Doping and anneal may be performed if undoped polysilicon or amorphous silicon is used for conductive layer 48. A protective insulation layer 54 (referred to herein as first protective insulation layer) is formed over the structure. Protective insulation layer 54 can be oxide, nitride, SiCN or combinations thereof. A photolithographic masking operation is used to cover the HV areas 4 with photoresist, while leaving the MC and logic areas 2/6 exposed. An insulation layer etch is used to remove protective insulation layer 54 from MC and logic areas 2/6. After the insulation layer etch and photoresist removal, a conductive layer 50 (referred to herein as fourth conductive layer), such as a polysilicon layer, is then formed on the structure over the protective insulation layer 54 in the HV area 4, and over conductive layer 48 in the MC and logic areas 2/6, where conductive layer 50 is formed directly on conductive layer 48 to collectively form a composite conductive layer 52 from both layers 48/50. Conductive layer 50 could instead be amorphous silicon, either in-situ doped or undoped. A chemical mechanical polish (CMP) or etch back is performed to planarize the top surface of the structure, which entirely removes the composite conductive layer 52 from the logic area 6, removes the conductive layer 50 from HV area 4, removes insulation layer 38 from logic area 6, and planarizes the top surface of composite conductive layer 52 in the MC area 2. Hard mask layer 28 in logic area 6 can be used as the stop layer for the CMP or etch back, as shown in FIGS. 12A, 12B and 12C.

A further etch back process is used to recess the upper surface of composite conductive layer 52 below the tops of stack structures S1 and S2 to a target height. At this point in the process, the majority of the memory cell formation is completed. A protective insulation layer 55 (referred to herein as second protective insulation layer) is formed over the structure, followed by a chemical mechanical polish (CMP) or etch back to planarize the top surface of the structure. Protective insulation layer 55 can be oxide, nitride, SiCN or combinations thereof. A photolithographic masking operation is used to cover the MC and HV areas 2/4 with photoresist, while leaving the logic area 6 exposed. One or more etches are used to remove protective insulation layer 55, hard mask layer 28, conductive layer 26 and insulation layer 24 in the logic area 6, as shown in FIGS. 13A, 13B and 13C (after photoresist removal). The protective insulation layers 54 and 55 protect the MC and HV areas 2/4 from this series of etches.

Implantations may be performed to form doped P and N wells in the substrate 10 in the logic area 6. A dielectric layer 56 is formed on the exposed substrate upper surface 10a in the logic area 6 (which can serve as the gate dielectric for the logic devices). Dielectric layer 56 can be silicon oxide, silicon oxynitride, a high-K dielectric layer, or a composite thereof. A high K insulation material is insulation material having a dielectric constant K greater than that of silicon dioxide. Examples of high K insulation materials include $HfO_2$, $ZrO_2$, $TiO_2$, $Ta_2O_5$, and combinations thereof. A dummy conductive layer 58, such as a polysilicon layer, is then formed over the structure. An insulation layer 59 (also referred to herein as a logic insulation layer 59) such as a nitride, and a hard mask layer 60, are then formed on dummy conductive layer 58. A photolithography masking operation is used to cover select portions of the logic area 6 with photoresist, leaving insulation layer 59 and hard mask layer 60 in the entire MC and HV areas 2/4, as well as portions of the logic area 6, exposed. An etch is then used to remove the exposed areas of the insulation layer 59 and hard mask layer 60 in the MC, HV, and logic areas 2/4/6. After photoresist removal, etches are used to remove the exposed portions of dummy conductive layer 58 and dielectric layer 56 (i.e., all portions not protected by the remaining portions of hard mask layer 60 in the logic area 6), leaving logic stack structures LS1 and LS2 in the logic area 6, which include blocks of dummy conductive material 58 disposed on remaining dielectric layer 56. Dielectric spacers 62 (e.g., nitride) are formed on the sides of logic stack structures LS1/LS2 by deposition and etch. Implantations into the substrate 10 in the logic area 6 can be performed. The resulting structure is shown in FIGS. 14A, 14B and 14C.

A photolithography masking operation is used cover the logic area 6, portions of HV area 4, and portions of the MC area 2, with photoresist 64 (i.e., cover the inner stack area, stack structures S1 and S2, and those portions of the outer stack areas immediately adjacent stack structures S1 and S2). Etches are used to remove exposed portions of protective insulation layers 54 and 55, composite conductive layer 52 and conductive layer 48 in the MC and HV areas 2/4, as shown in FIGS. 15A, 15B and 15C. After photoresist 64 is removed, additional selective implantations and etches can be performed in the different exposed portions of substrate 10 (i.e., by additional photolithography mask operations and implantations). For example, the logic area 6 can be covered by photoresist leaving MC and HV areas 2/4 exposed, and the portions of substrate 10 covered by insulation layers 38 and 46 are subjected to implantation. A photolithography masking operation can be used cover the logic area 6, leaving MC and HV areas 2/4 exposed. An etch is then used to thin exposed portions of insulation layers 38 and 46 (which also thins protective insulation layers 54 and 55), which can provide better implant penetration in the HV area 4 later in the process. The resulting structure is shown in FIGS. 16A, 16B and 16C (after photoresist removal).

A semi-nonconformal layer 70 is formed on the structure. The semi-nonconformal layer 70 carries some of the conformality of the underlying topography, but is thinner at the tops of the underlying topography compared to where vertical and horizontal surfaces meet. To achieve such a varying thickness, a flowable material may be used to form layer 70. One non-limiting example material for semi-nonconformal layer 70 is a BARC material (bottom anti-reflectant coating), which is commonly used to reduce reflectivity at resist interfaces during photolithography. BARC materials are flowable and wettable, and are easily etched and removed with minimal process damage due their high selectivity relative to oxide. Other materials that can be used for semi-nonconformal layer 70 include photoresist or spin-on-glass (SOG). An etch (e.g., anisotropic) is used to remove the upper portion of semi-nonconformal layer 70 from, and to expose, protective insulation layers 54 and 55 on the stack structures S1/S2 and on the remaining portions of composite conductive layer 52 and conductive layer 48, and hard mask layer 60 on logic stack structures LS1/LS2, while keeping semi-nonconformal layer 70 covering insulation layers 38 and 46 (i.e., this portion of semi-nonconformal layer 70 acts as a hard mask for the next etch operation). An etch is used to remove hard mask layer 60 on the logic stack structures LS1/LS2. The resulting structure is shown in FIGS. 17A, 17B and 17C.

After removal of semi-nonconformal layer 70, oxide and nitride depositions, followed by a spacer etch, are used to form oxide spacers 66 and nitride spacers (not shown) on the sides of stack structures S1/S2 in the MC area 2, on the sides of stack structures LS1/LS2 in the logic area 6, and on the sides of the structures in the HV area 4. Implantations are performed to form drain regions 74 (referred to herein as first drain regions 74) in the substrate adjacent the oxide spacers 66 in the MC area 2, source and drain regions 76/78 (referred to herein as second source regions 76 and second drain regions 78) adjacent the oxide spacers 66 in the HV area 4, and source and drain regions 80/82 (referred to herein as third source regions 80 and third drain regions 82) adjacent the oxide spacers 66 and dummy conductive material 58 in the logic area 6. Implantations for any given region may be performed by forming photoresist to block the implantation for other region(s) not to be implanted. For example, drain regions 74 in the MC area 2, source/drain regions 76/78 in the HV area 4, and source/drain regions 80/82 in the logic area 6, of the same doping type, can be formed simultaneously by forming photoresist on area of the opposite source/drain doping type, and then performing a single implantation in the MC, HV, and logic areas 2/4/6. A blocking layer 84 may be formed by deposition, masking operation and etch, for blocking any silicidation in a subsequent operation. Any remaining portions of protective insulation layers 54 and 56 in the MC and HV areas 2/4, which are not protected by blocking layer 84, are also removed during this etch, exposing composite conductive layer 52 and conductive layer 48 to subsequent silicidation. Metal deposition and anneal is then performed to form silicide 86 on the top surfaces of exposed portions of composite conductive layer 52 and conductive layer 48, source regions 76/80 and drain regions 74/78/82. Blocking layer 84 prevents silicide formation for any portions for which such formation is not desired. Optionally, blocking layer 84 may be maintained in select portions of any of the source/drain regions 74/76/78/80/82 and portions of conductive layer 48, to block silicide formation in these select regions. An etch, such as a nitride etch, is then used to remove the nitride spacers on oxide spacers 66 and insulation layer 59 in the logic area 6 (exposing the blocks of dummy conductive layer 58) and hard mask layer 28 in the MC area 2. The resulting structure is shown in FIGS. 18A, 18B and 18C.

An insulation layer 88 (e.g., nitride) is formed over the structure. A relatively thick layer of insulation material 90 (also referred to herein as inter-layer dielectric (ILD) insulation material layer) is then formed on insulation layer 88. CMP is performed to planarize and recess the ILD insulation material layer 90 to expose dummy conductive layer 58 in the logic area 6. A photolithography masking operation is used to cover the MC and HV areas 2/4 with photoresist, while leaving the logic area 6 exposed. An etch, such as a polysilicon etch, is then used to remove the blocks of dummy conductive layer 58 in the logic area 6. A layer of metal material such as Al, Ti, TiAlN, TaSiN, TaN, TiN, or other appropriate metal material, without limitation, or a composite thereof, is formed over the structure. A CMP is then performed to remove the layer of metal material, leaving blocks of metal material 94 disposed on dielectric layer 56 in the logic area 6. The final structure is shown in FIGS. 19A, 19B and 19C.

FIG. 20 shows the final memory cell structure in the MC area 2, which includes pairs of memory cells each sharing a source region 42 spaced apart from two drain regions 74, with channel regions 96 in the silicon 10 extending there between. Each memory cell includes a floating gate 14a (i.e., a block of conductive material remaining from conductive layer 14) disposed over and insulated from a first portion of the channel region 96 for controlling the conductivity thereof, a select gate 52a (i.e., which can also be referred to a word line gate, and is a block conductive material remaining from composite conductive layer 52) disposed over and insulated from a second portion of the channel region 96 for controlling the conductivity thereof, a control gate 26a (i.e., a block of conductive material remaining from conductive layer 26) disposed over and insulated from the floating gate 14a, and an erase gate 52b (i.e., a block of conductive material remaining from composite conductive layer 52) disposed over and insulated from the source region 42 (shared by the pair of memory cells). The pairs of memory cells extend in a column direction (i.e., in the bit line direction), and columns of the memory cells are formed, with STI oxide 22 between adjacent columns. A row of the control gates 26a are formed as a continuous control gate line that connects the control gates 26a together for an entire row of the memory cells. A row of the select gates 52a are formed as a continuous select gate line (also referred to herein a word gate line) that connects the select gates 52a together for an entire row of the memory cells. A row of the erase gates 52b are formed as a continuous erase gate line that connects the erase gates together for an entire row of pairs of the memory cells.

Figure 21:
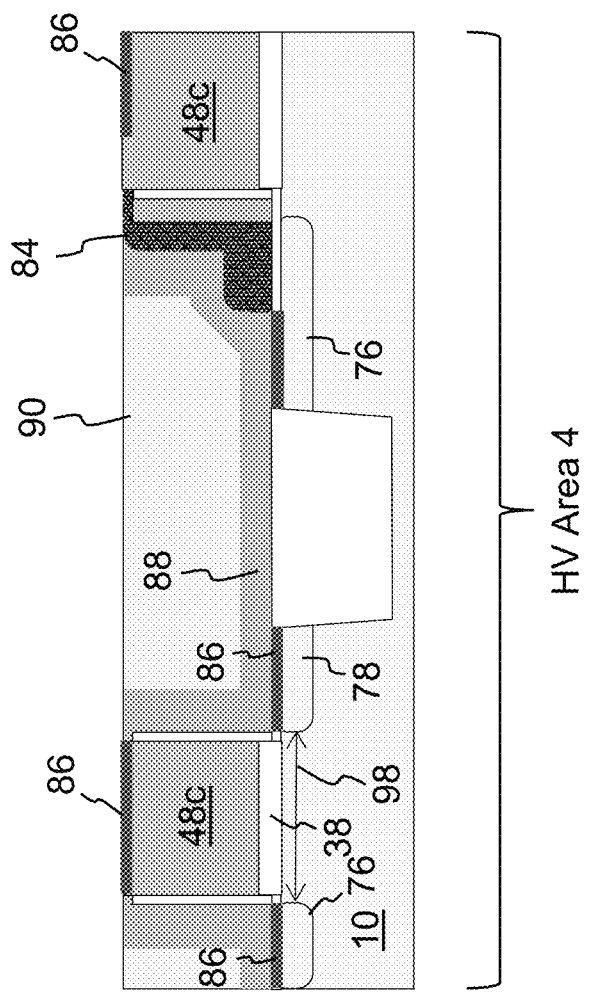
FIG. 21 is a cross sectional view of the HV area showing the finished HV devices.

The final HV devices are shown in FIG. 21. Each HV device includes spaced apart source and drain regions 76 and 78 with a channel region 98 of the silicon substrate 10 extending there between. An HV gate 48c (i.e., a block of conductive material remaining from conductive layer 48) is disposed over and insulated from the channel region 98 for controlling the conductivity thereof (i.e., source and drain regions 76 and 78 are adjacent HV gate 48c).

Figure 22:
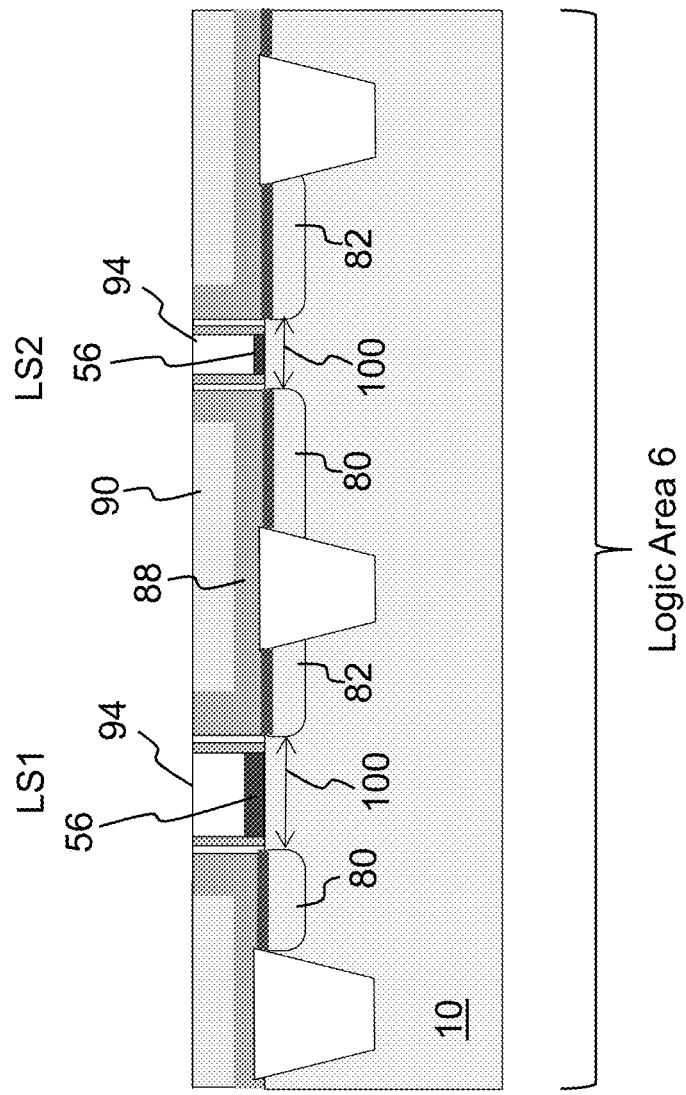
FIG. 22 is a cross sectional view of the logic area showing the finished logic devices.

The final logic devices are shown in FIG. 22. Each logic device includes spaced apart source and drain regions 80 and 82 with a channel region 100 of the silicon substrate 10 extending there between. Blocks of metal material 94 are metal gates 94 disposed over and insulated from the channel region 100 (by dielectric layer 56) for controlling the conductivity thereof (i.e., source and drain regions 80 and 82 are adjacent metal gate 94).

There are a number of advantages of the above-described method of forming memory cells, HV devices and logic devices on the same substrate. The memory cells and HV devices formation is completed before the metal gates 94 are formed in the logic area 6, so that the metal gates 94 in the logic area 6 will not be adversely affected by the formation of the memory cells and HV devices. The process operations for the formation of the gates in the MC and HV areas 2/4 are separate and independent from (and can be customized relative to) the process operations for the formation of the gates in the logic area 6. The MC and HV areas 2/4 are covered by protective insulation layer 54 and 55 after most of the memory cell and HV device formation is completed and before the processing in the logic area 6 (i.e., before the removing of the layers in the logic area 6 left from the memory cell and HV device formation, and before the depositing and removing of the layers used for forming the logic devices including dummy polysilicon removal, without limitation). The upper surface 10a of the substrate 10 is recessed in the MC and HV areas 2/4 relative to that in the logic area 6 to accommodate the taller structurers in the MC/HV areas 2/4 (i.e., so that tops of the shorter logic devices in the logic area 6 are approximately even with the tops of the taller memory cells and HV devices in the MC/HV areas 2/4, and so that CMP across all three areas can be used for processing—e.g., the tops of the select gates 52*a* and HV gates 48*c* are substantially even with dummy conductive layer 58 during the CMP of ILD 90). Layer 88 protects the silicided conductive layer 48 and silicided composite conductive layer 52 from the CMP used in forming the metal gates 94, and the conductive layer 26 assists as a stop layer for this CMP. Silicide 86 enhances the conductivity of the drain regions 74, and source/drain regions 76/78, source/drain regions 80/82, select gates 52*a*, erase gates 52*b* and HV gates 48*c*. The semi-nonconformal layer 70 protects the oxide and silicon in the source/drain regions of the MC and HV areas 2 while hard mask layer 60 is being removed from the logic area 6. The memory cell select gates 52*a*, memory cell erase gates 52*b* and HV gates 48*c*, are formed using a single conductive material deposition (i.e., a single polysilicon layer formed by a single polysilicon deposition can be used to form all three types of gates). Moreover, the same polysilicon etch may be used define one of the edges of each select gate 52*a* and both edges of each HV gate 48*c*. The thicknesses of the various layers 46, 12, 38 and 56 (which are used as gate oxides) are independent of each other and therefore may be independently set for the respective gate operation. For example, insulation layer 46 under the select gates 52*a* can be thinner than oxide layer 12 under the floating gates 14*a*.

Formation of the STI insulation 22 in the various areas is improved by removing polysilicon layer 14 and oxide layer 12 in the logic area 6 and a portion of the dummy area 8 before the formation of oxide layer 18 and nitride layer 20, and then forming the STI trenches 10*b* in the logic area 6 separately from forming the STI trenches 10*c* in the MC and HV areas 2/4. This results in creating the STI trenches in the logic area 6 without having to etch through polysilicon layer 14 and oxide layer 12 (i.e., oxide layer 12 can be difficult to punch through during the trench etch). Therefore, it is easier to obtain the desired dimensions of the trenches 10*b* and trenches 10*c* by forming them separately through different layers and with different trench etches, which results in better STI profiles in all three areas. It also allows the layers existing in the MC and HV areas 2/4, and the layers existing in the logic area 6, to be set for their respective trench etches without having to compromise if a common trench etch be used for all three areas. Providing dummy area 8, in which the transition between nitride layer 20 being formed over three layers (12, 14, 18) in the MC and HV areas 2/4, and nitride layer 20 being formed over a single layer (18) in the logic area 6, and in which trench 10*b* is formed in one portion and trench 10*c* is formed in another portion, provides a transition area that is protected by photoresist during both the STI etch in the MC and HV areas 2/4 (to form trenches 10*c*) and the STI etch in the logic area 6 (to form trenches 10*b*). Dummy area 8 as a transition area prevents transition area silicon double etching that could occur if a trench formed in the first STI etch is exposed during the second STI etch. Lastly, filling both types of trenches 10*b* and 10*c* using a single oxide deposition reduces complexity.

The CMP used to planarize composite conductive layer 52 in the MC area 2, followed by an etch to recess the composite conductive layer 52 below the tops of the stack structures S1 and S2 (see FIGS. 12A-12C and related descriptions), provides reliable control of the height of composite conductive layer 52 in the MC area 2 (e.g., using auto process control (APC) to measure the composite conductive layer 52 thickness before the etch process, and then derive the etch time based on etch rate of the etch), to enable height differentiation between composite conductive layer 52 in the MC area 2 and conductive layer 48 in the HV area 4, thus avoiding an additional masking operation. Finally, the protective insulation layers 54 and 55 in the MC and HV areas 2/4, and the hard mask layer 60 in the logic area 6, are etched after the formation of the semi-conformal layer 70 is formed, thus avoiding the need for an extra masking operation before forming silicide 86.

It is to be understood that the present disclosure is not limited to the examples described above and illustrated herein, but encompasses any and all variations falling within the scope of the appended claims. For example, references to the present disclosure herein are not intended to limit the scope of any claim or claim term, but instead merely make reference to one or more features that may be covered by one or more of the claims. Materials, processes and numerical examples described above are examples only, and should not be deemed to limit the claims. Further, as is apparent from the claims and specification, not all method operations need be performed in the exact order illustrated or claimed, but rather in any order that allows the proper formation of the memory cell area and the logic areas of the present invention, unless otherwise specified in the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
   providing a substrate of semiconductor material that includes a first area, a second area, a third area and a dummy area, wherein the dummy area has first and second portions;
   recessing an upper surface of the substrate in the first area, an upper surface of the substrate in the second area, and an upper surface of the substrate in the dummy area, the recessing relative to an upper surface of the substrate in the third area;
   forming a first conductive layer disposed over and insulated from the upper surfaces in the first area, the second area, the third area and the dummy area;
   removing the first conductive layer from the third area and from the second portion of the dummy area;
   forming a first insulation layer in the first area, the second area, the third area and the dummy area;
   forming first trenches through the first insulation layer and into the substrate in the third area and the second portion of the dummy area;
   after the forming the first trenches, forming second trenches through the first insulation layer and the first conductive layer and into the substrate in the first area, the second area and the first portion of the dummy area;

filling the first and second trenches with insulation material;

after the filling of the first and second trenches, removing the first insulation layer from the first area, the second area, the third area and the dummy area;

forming a second insulation layer in the first area, the second area and the third area;

forming a second conductive layer on the second insulation layer in the first area, the second area and the third area;

performing one or more etches to selectively remove portions of the first and second conductive layers in the first area, to entirely remove the first and second conductive layers from the second area, and to entirely remove the second conductive layer from the third area, wherein the one or more etches result in pairs of stack structures in the first area with each of the stack structures including a control gate of the second conductive layer disposed over and insulated from a floating gate of the first conductive layer;

forming first source regions in the substrate of the first area each disposed between one of the pairs of stack structures;

forming a third conductive layer disposed over and insulated from the upper surfaces of the substrate in the first area, the second area and the third area;

forming a first protective insulation layer over the third conductive layer in the second area;

after the forming of the first protective insulation layer, forming a fourth conductive layer disposed over the first protective insulation layer in the second area, and over the third conductive layer in the first and third areas, wherein the third and fourth conductive layers form a composite conductive layer in the first area;

performing a chemical mechanical polish or etch-back to remove the third and fourth conductive layers from the third area, and to remove the fourth conductive layer from the second area;

performing an etch to recess an upper surface of the composite conductive layer below tops of the stack structures in the first area, leaving a plurality of erase gates of the composite conductive layer each respectively disposed over and insulated from one of the first source regions in the first area;

forming a second protective insulation layer over the composite conductive layer in the first area;

removing the second conductive layer and the second insulation layer from the third area;

after the removing of the second conductive layer and the second insulation layer from the third area, forming blocks of dummy conductive material disposed over and insulated from the upper surface of the substrate in the third area;

after the forming of the blocks of dummy conductive material in the third area, etching portions of the first and second protective insulation layers, portions of the composite conductive layer in the first area and portions of the third conductive layer in the second area to form a plurality of select gates of the composite conductive layer in the first area each disposed adjacent to one of the stack structures, and to form a plurality of HV gates of the third conductive layer in the second area each disposed over and insulated from the upper surface of the substrate;

forming first drain regions in the substrate of the first area each adjacent to one of the select gates;

forming second source regions in the substrate of the second area each adjacent one of the HV gates;

forming second drain regions in the substrate of the second area each adjacent one of the HV gates;

forming third source regions in the substrate of the third area each adjacent one of the blocks of dummy conductive material;

forming third drain regions in the substrate of the third area each adjacent one of the blocks of dummy conductive material; and replacing each of the blocks of dummy conductive material of the third area with a block of metal material.

2. The method of claim 1, wherein each of the blocks of metal material is insulated from the upper surface of the substrate in the third area by a layer of high K insulation material.

3. The method of claim 1, wherein before the replacing, each of the blocks of dummy conductive material is insulated from the upper surface of the substrate in the third area by a layer of high K insulation material, and wherein the replacing further comprises forming each of the blocks of metal material on the layer of high K insulation material.

4. The method of claim 1, wherein each of the first, second, third and fourth conductive layers is formed of polysilicon or amorphous silicon.

5. The method of claim 1, further comprising:
forming silicide on the first, second and third drain regions and on the second and third source regions.

6. The method of claim 1, further comprising:
before the replacing, forming silicide on the select gates, the erase gates and the HV gates.

7. The method of claim 1, wherein the second insulation layer is an insulation layer having first oxide, nitride and second oxide sublayers.

8. The method of claim 1, wherein the forming of the blocks of dummy conductive material includes forming a logic insulation layer on the blocks of dummy conductive material and a hard mask layer on the logic insulation layer.

9. The method of claim 8, wherein before the replacing, further comprising:
forming a layer of flowable material in the first, second and third areas;
removing a portion of the layer of flowable material to expose the hard mask layer;
removing the hard mask layer; and
removing the layer of flowable material.

10. The method of claim 9, further comprising:
forming silicide on the select gates, the erase gates and the HV gates, wherein the logic insulation layer prevents the forming of silicide on the blocks of dummy conductive material.

* * * * *